Figure 2C:
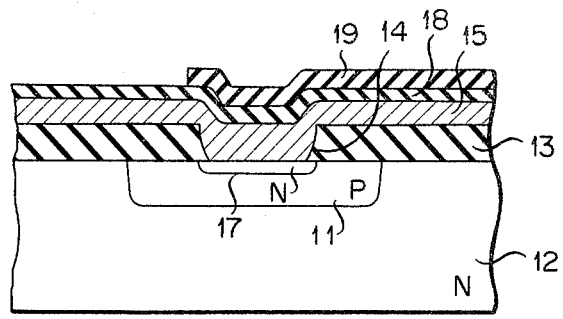

United States Patent [19]

Oshima et al.

[11] 4,403,392
[45] Sep. 13, 1983

[54] METHOD OF MANUFACTURING A SEMICONDUCTOR DEVICE

[75] Inventors: Jiro Oshima; Masaharu Aoyama; Seiji Yasuda, all of Yokohama; Toshio Yonezawa, Yokosuka, all of Japan

[73] Assignee: Tokyo Shibaura Denki Kabushiki Kaisha, Kawasaki, Japan

[21] Appl. No.: 152,305

[22] Filed: May 22, 1980

[30] Foreign Application Priority Data

Jun. 6, 1979 [JP] Japan .................................. 54-71042

[51] Int. Cl.³ .......................................... H01L 21/225
[52] U.S. Cl. .................................... 29/569 R; 29/578; 29/591; 29/571; 148/187; 148/188
[58] Field of Search ............. 29/578, 591, 571, 569 R; 148/188, 187

[56] References Cited

U.S. PATENT DOCUMENTS

| | | | |
|---|---|---|---|
| 4,074,304 | 2/1978 | Shiba ............................ | 148/188 X |
| 4,124,934 | 11/1978 | DéBrebisson ..................... | 29/591 X |
| 4,143,178 | 3/1979 | Harada et al. .................. | 148/188 X |

FOREIGN PATENT DOCUMENTS 49-32635  8/1974  Japan.
49-32637  8/1974  Japan.

OTHER PUBLICATIONS

Shiba et al., "Rapid and Large Capacity Bipolar Devices", *Electronic Materials*, Aug. 1978, pp. 119-124.

*Primary Examiner*—G. Ozaki
*Attorney, Agent, or Firm*—Finnegan, Henderson, Farabow, Garrett & Dunner

[57] ABSTRACT

A method for manufacturing a semiconductor device having a high breakdown voltage and a high reliability, comprises (a) forming on a semiconductor substrate an insulating layer having a diffusion window; (b) forming an impurity-doped poly-silicon layer on the insulating layer and on that portion of the semiconductor substrate which is exposed through the diffusion window; (c) forming an undoped poly-silicon layer on the impurity-doped poly-silicon layer; (d) thermally oxidizing the substrate with the insulating layer, impurity-doped poly-silicon layer and undoped poly-silicon layer, thus diffusing the impurity from the impurity-doped poly-silicon layer into the semiconductor substrate through the diffusion window and converting the undoped poly-silicon layer to a silicon oxide layer; (e) forming on the silicon oxide layer an oxidation-resisting mask layer in a desired pattern; and (f) thermally oxidizing the substrate with the insulating layer, impurity-doped poly-silicon layer, silicon oxide layer and mask layer, thus converting those portions of the impurity-doped poly-silicon layer which lie beneath those portions of the silicon oxide layer which are exposed through the mask layer to impurity-doped silicon oxide layers, whereby the remaining portions of the impurity-doped poly-silicon layer provide an interconnection electrode layer having a desired pattern.

8 Claims, 7 Drawing Figures

F I G. 1A 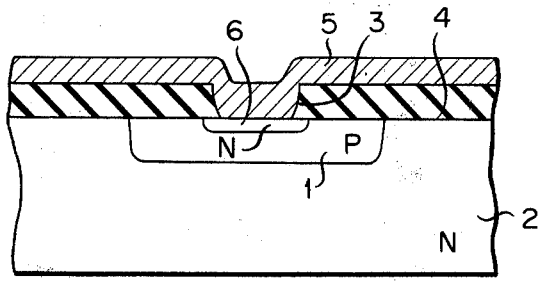
F I G. 1B 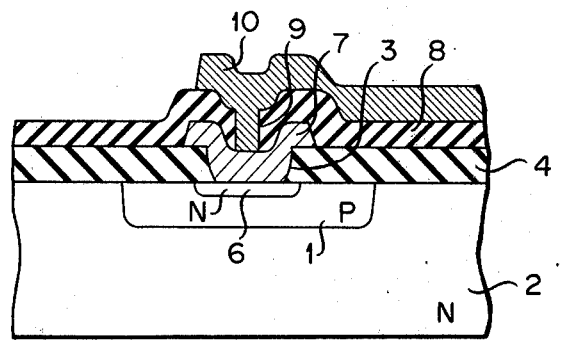
F I G. 2A 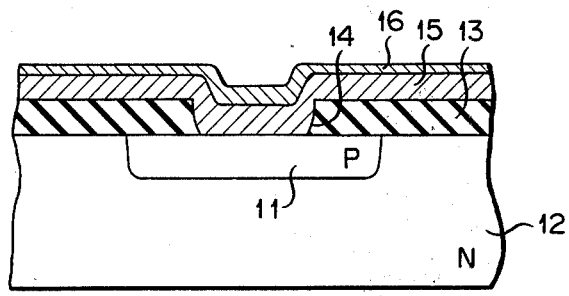
F I G. 2B 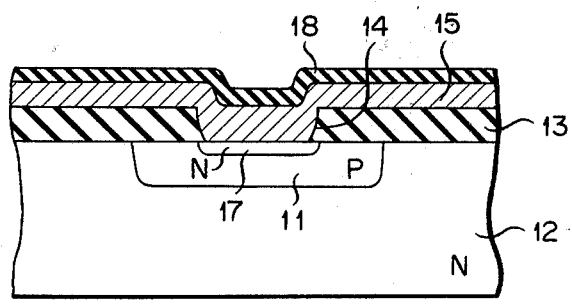

METHOD OF MANUFACTURING A SEMICONDUCTOR DEVICE

This invention relates to a semiconductor device and more particularly a semiconductor device with an impurity-doped poly-silicon layer used as an interconnection electrode and also as a diffusion source and to a method of manufacturing said semiconductor device.

Already known is the method of FIGS. 1A and 1B for manufacturing a semiconductor device which has an impurity-doped poly-silicon layer used as not only an interconnection electrode but also a diffusion source. In this method the semiconductor device is manufactured in the following manner.

First, as shown in FIG. 1A, an insulating layer 4 having a diffusion window 3 is formed of an N-type silicon substrate 2 having a P-type base region 1. An arsenic-doped poly-silicon layer 5 is then formed on the insulating layer 4 and the substrate 2, thus plugging the window 3 of the insulating layer 4. This done, the substrate 2 with the layers 4 and 5 is heated in an nitrogen atmosphere. During this heat treatment the arsenic in the poly-silicon layer 5 diffuses into the silicon substrate 2 through the diffusion window 3, thereby forming an N-type emitter region 6. Then, as shown in FIG. 1B, the poly-silicon layer 5 is selectively etched by means of photolithography, leaving an interconnection electrode layer 7 partly on the N-type emitter region 6 and partly on the insulating layer 4. An insulating layer 8 is then formed by CVD method, thus covering the insulating layer 4 and the interconnection electrode layer 7. A contact hole 9 is made in the insulating layer 8 so that the interconnection electrode layer 7 is exposed. Thereafter an aluminum layer 10 is vapor-deposited on the insulating layer 8 and in the contact hole 9. The aluminum layer 10 is cut in a specific pattern, thus providing an aluminum electrode 10 which is connected to the emitter region 6 through the interconnection electrode layer 7. In this way such a bipolar transistor as shown in FIG. 1B is manufactured.

In the above-described known method the patterning of the arsenic-doped poly-silicon layer is conducted by selective etching. As a result, a stepped portion is inevitably formed between the insulating layer 4 and the interconnection electrode layer 7 as illustrated in FIG. 1B. Due to this stepped portion the aluminum electrode 10 will likely be cut at a portion right above the stepped portion. This greatly reduces the reliability and yield of the semiconductor device. Further, to prevent the emitter region 6 from being etched during the etching of the poly-silicon layer 5, the interconnection electrode layer 7 must be made much wider than the diffusion window 3 of the insulating layer 4, and this hinders the improvement to integrated circuit packing density.

To prevent an aluminum electrode from being cut because of the presence of a stepped portion a new method of manufacture has recently come into use. This method comprises steps of forming a diffusion layer on a semiconductor substrate, using an arsenic-doped poly-silicon layer as a diffusion source; forming on the poly-silicon layer an oxidation-resisting mask layer of silicon nitride having a specific pattern; and thermally oxidizing in a wet atmosphere those portions of the poly-silicon layer which are not covered with the mask layer, thereby forming insulating layers and an interconnection electrode layer, i.e., those portions of the poly-silicon layer which are covered with the mask layer. Indeed this method forms no stepped portion between each insulating layer and the interconnection electrode layer and can therefore form an aluminum electrode without a cut. Since the silicon nitride layer is formed directly on the arsenic-doped poly-silicon layer, however, it will have cracks due to the difference in thermal expansion between it and the poly-silicon layer when the poly-silicon layer is thermally oxidized to provide insulating layers. Through the cracks oxygen will attack even those portions of the poly-silicon layer which are covered by the silicon nitride layer, ultimately rendering these portions of the poly-silicon layer electrically insulative.

In order to prevent cracking of the silicon nitride layer and to render only the desired portions of the arsenic-doped poly-silicon layer electrically insulative, two methods have been proposed. In one method, an arsenic-doped poly-silicon layer is thermally oxidized, thus forming an arsenic silicide glass layer (AsSG layer), and a silicon nitride layer of a specific pattern is then formed on the AsSG layer. In the other method, an $SiO_2$ layer is deposited on an arsenic-doped poly-silicon layer by CVD method, and a silicon nitride layer of a specific pattern is then formed on the $SiO_2$ layer. The first method is, however, disadvantageous. During the thermal oxidation of the poly-silicon layer in a wet atmosphere, using the silicon nitride layer as a mask, the silicon nitride layer reacts with the AsSG layer on the poly-silicon layer. As a result, the silicon nitride layer is melted to the extent that its pattern precision is largely lowered and its properties are changed so much that its masking ability is lost. Though not having the drawbacks of the first method, the second method cannot provide a sufficient breakdown voltage across the poly-silicon layer and the interconnection electrode layer unless the $SiO_2$ layer is made 2,000 to 4,000 Å thick. This is because an $SiO_2$ layer provided by CVD method is not sufficiently dense. But such a thick $SiO_2$ layer does not have a uniform thickness. Nor is it homogeneous. When the poly-silicon layer is thermally oxidized in a wet atmosphere, using the silicon nitride layer as a mask, the CVD-$SiO_2$ layer which is thick and not homogeneous and which is interposed between the silicon nitride layer and the poly-silicon layer will degrade the oxidation pattern of the poly-silicon layer or will vary the width of the individual interconnection electrode layer subsequently formed.

An object of this invention is to provide a method for manufacturing a semiconductor device having a high breakdown voltage and a high reliability, said method being able to form an interconnection electrode layer in a precise pattern which forms, jointly with other layers, stepped portions as low as possible.

Another object of this invention is to provide a semiconductor device which has a high breakdown voltage and a high reliability and which has an interconnection electrode layer formed in a precise pattern and forming jointly with other layers as low stepped portions as possible.

According to this invention there is provided a method for manufacturing a semiconductor device, comprising:

(a) forming on a semiconductor substrate an insulating layer having a diffusion window;

(b) forming an impurity-doped poly-silicon layer on the insulating layer and on that portion of the semiconductor substrate which is exposed through the diffusion window;

(c) forming an undoped poly-silicon layer on the impurity-doped poly-silicon layer;

(d) thermally oxidizing the substrate with the insulating layer, impurity-doped poly-silicon layer and undoped poly-silicon layer, thus diffusing the impurity from the impurity-doped poly-silicon layer into the semiconductor substrate through the diffusion window and converting the undoped poly-silicon layer to a silicon oxide layer;

(e) forming on the silicon oxide layer an oxidation-resisting mask layer in a desired pattern; and (f) thermally oxidizing the substrate with the insulating layer, impurity-doped poly-silicon layer, silicon oxide layer and mask layer, thus converting those portions of the impurity-doped poly-silicon layer which lie beneath those portions of the silicon oxide layer which are exposed through the mask layer to impurity-doped silicon oxide layers, whereby the remaining portions of the impurity-doped poly-silicon layer provide an interconnection electrode layer having a desired pattern.

Further, the present invention provides a semiconductor device comprising:

(a) a semiconductor substrate having an impurity-doped region;

(b) an insulating layer covering the surface of the semiconductor substrate except for the surface of the impurity-doped region;

(c) an interconnection electrode layer formed on selected portions of the insulating layer and on the entire impurity-doped region, said interconnection electrode layer being made of poly-silicon doped with the same impurity as that of the impurity-doped-region;

(d) an undoped first silicon oxide layer formed on the interconnection electrode layer; and (e) a second silicon oxide layer consisting of an upper undoped portion and a lower doped portion which covers those portions of the insulating layer which are not covered with the interconnection electrode layer and which lie respectively along the interconnection electrode layer and the undoped silicon oxide layer, thereby defining the region occupied by the interconnection electrode layer.

This invention can be more fully understood from the following detailed description when taken in conjunction with the accompanying drawings, in which:

FIGS. 1A and 1B are cross sectional views of a semiconductor device, illustrating how a bipolar transistor is manufactured by a known method; and FIGS. 2A to 2E are cross sectional views of a semiconductor device, illustrating how a bipolar transistor according to this invention is manufactured.

According to this invention, an impurity-doped poly-silicon layer is formed on a substrate. The impurity-doped poly-silicon layer will serve as a diffusion source and an interconnection electrode layer. On this poly-silicon layer an undoped poly-silicon layer is laid. The substrate with these poly-silicon layers is then subjected to thermal oxidation, whereby the impurity is diffused into the substrate and at the same time the undoped poly-silicon layer is converted to a dense silicon oxide layer with a high breakdown voltage. The substrate with the poly-silicon layer and the silicon oxide layer is thermally oxidized again at a high temperature in such a way that the impurity-doped poly-silicon layer under the silicon oxide layer has some portions changed to silicon oxide. The other portions of the impurity-doped poly-silicon layer remain unchanged, thereby providing an interconnection electrode layer having a desired pattern.

That is, the patterning of the interconnection electrode layer is achieved by selective oxidation of the impurity-doped silicon layer, not by etching of the impurity-doped poly-silicon layer. The stepped portions of the interconnection electrode layer are therefore so low that continuous metal electrodes can be formed. Since a dense undoped silicon oxide layer of a high breakdown voltage is formed on the interconnection electrode layer, all the drawback inherent to the known methods can be removed. More precisely, a silicon nitride layer, i.e., an oxidation mask, formed on the undoped silicon oxide layer does not melt unlike in the known method because no AsSG layer is formed on the undoped silicon oxide layer which is formed on the interconnection electrode layer. For this reason the precision of patterning of the impurity-doped poly-silicon layer will not be degraded. It will not be degraded also because the silicon oxide layer formed between the silicon nitride layer and the impurity-doped poly-silicon layer is dense and thin and has a high breakdown voltage, not such a thick silicon oxide layer as is formed in the known method by CVD process.

The undoped silicon oxide layer formed on the interconnection electrode layer has an impurity concentration of $1 \times 10^{17}$ cm$^{-3}$ or less. Every portion of the interconnection electrode layer has its sides put in contact with the impurity-doped silicon oxide layer which has been formed by selectively oxidizing the impurity-doped poly-silicon layer. The impurity-doped silicon oxide layer defines the interconnection electrode layer having a desired pattern, and has an impurity concentration of $1 \times 10^{18}$ cm$^{-3}$ to $1 \times 10^{22}$ cm$^{-3}$. On the impurity-doped silicon oxide layer there is formed undoped silicon oxide layer having an impurity concentration of $1 \times 10^{17}$ cm$^{-3}$ or less. These doped silicon oxide layer and the undoped silicon oxide layer constitute a silicon oxide layer which of course consists of doped portions and undoped portions.

According to this invention the impurity-doped poly-silicon layer may be formed by CVD method, by sputtering method or by impurity ion implantation into to the undoped poly-silicon layer.

Preferably the undoped poly-silicon layer is about 500 to about 1,000 Å. If it is more than 1,000 Å thick, the stepped portions of the interconnection electrode layer become too high and a considerably long time is required to oxidize the impurity-doped poly-silicon layer which lies beneath the undoped poly-silicon layer.

Proper temperature and proper time may be selected for the thermal oxidation of the impurity-doped poly-silicon layer, according to various factors such as the desired degree of impurity diffusion in the impurity-doped poly-silicon layer and the desired thickness of the undoped poly-silicon layer.

Now referring to FIGS. 2A to 2E, it will be described how a bipolar transistor was manufactured according to this invention.

EXAMPLE

As shown in FIG. 2A, silicon oxide (SiO$_2$) was deposited by CVD method to form a layer 13 3,000 Å thick on the major surface of an N-type silicon substrate 12 with a P-type silicon base region 11 formed in it. The SiO$_2$ layer 13 was selectively etched by means of photolithography, thus forming a diffusion window 14 to expose the base region 11. The diffusion window 14 has smaller than the base region 11. Then, an arsenic-doped poly-silicon layer 15 2,000 Å thick having an arsenic concentration of $1 \times 10^{20}$ cm$^{-3}$ was formed by sputtering method. On the arsenic-doped poly-silicon layer 15 there was formed an undoped poly-silicon layer 16 500 Å thick also by sputtering method. Thereafter the substrate 12 with the layers 13, 15 and 16 was heated at 1,000° C. for 20 minutes in the presence of oxygen. During this heat treatment the arsenic was diffused from the arsenic-doped poly-silicon layer 15 into the P-type base region 11 through the diffusion window 14. As a result, an emitter region 17, i.e., an N-type diffusion region, was formed in the P-type base region 11 as illustrated in FIG. 2B. At the same time the undoped poly-silicon layer 16 was oxidized to form a dense undoped silicon oxide layer 18.

Figure 2D:
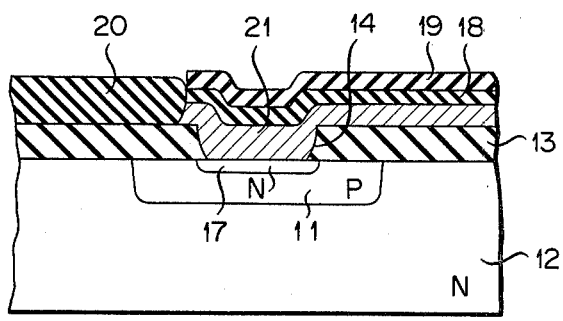

Thereafter, as shown in FIG. 2C, a silicon nitride (Si$_3$N$_4$) layer 1,000 Å thick was formed on the silicon oxide layer 18 and selectively etched by means of photolithography, thus leaving a Si$_3$N$_4$ layer 19 having a desired pattern. The substrate 12 with the layers 13, 15, 18 and 19 was subjected to thermal oxidation. The thermal oxidation was conducted in a wet atmosphere of 9 atm. at 800° C. for about 60 minutes. During the thermal oxidation the Si$_3$N$_4$ layer 19 neither cracked nor melted since the undoped silicon oxide layer 18 lies between the arsenic-doped poly-silicon layer 15 and the Si$_3$N$_4$ layer 19. The Si$_3$N$_4$ layer 19 therefore preserved its clear-cut pattern and well served as an oxidation mask. Consequently, that portion of the arsenic-doped poly-silicon layer 15 which lay beneath that portion of the silicon oxide layer 18 on which the Si$_3$N$_4$ layer 19 did not exist was oxidized, whereby said portions of the layers 15 and 18 were put together to form an arsenic-doped silicon oxide layer 20. The other portion of the layer 15 was therefore insulated by the silicon oxide layer 20. In this way there was provided an interconnection electrode layer 21 which had a desired pattern and which was made of arsenic-doped poly-silicon, as shown in FIG. 2D.

Figure 2E:
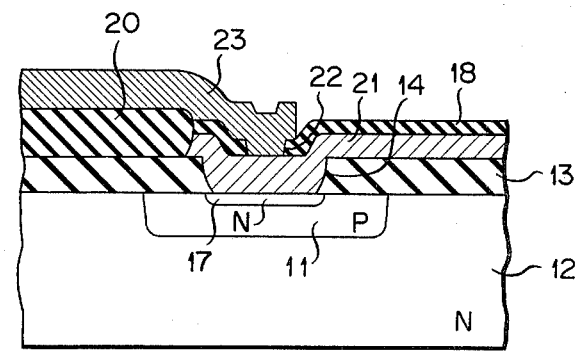

The silicon nitride layer 19 was then removed by plasma etching. This done, a contact hole 22 was formed in the silicon oxide layer 18, thereby exposing the interconnection electrode layer 21. Thereafter an aluminum layer was formed by vapor deposition and selectively etched in a desired pattern. As a result, as shown in FIG. 2E, there was formed an aluminum electrode 23 which was connected to the emitter region 17 through the interconnection electrode layer 21 and the contact hole 22, whereby a bipolar transistor was manufactured.

The bipolar transistor thus manufactured had an interconnection electrode layer with a highly precise pattern and extremely low stepped portions and an aluminum electrode with no discontinuity and thus highly reliable. The silicon oxide layer lying between the interconnection electrode layer and the aluminum electrode was sufficiently dense and had no pin-holes. The bipolar transistor therefore had a sufficiently high breakdown voltage.

In order to elevate further the breakdown voltage between the aluminum electrode and the interconnection electrode layer, a CVD-SiO$_2$, Si$_3$N$_4$ or SiC may be deposited before making a contact hole in the silicon oxide layer which has been converted from the undoped poly-silicon layer.

This invention may be applied to manufacture of not only a bipolar transistor but also an MOS transistor.

As described in detail, according to this invention, an undoped poly-silicon is deposited on an impurity-doped poly-silicon layer which serves as a diffusion source and as an interconnection electrode and is then thermally oxidized to form a dense silicon oxide layer having a high breakdown voltage. A silicon nitride layer formed on the silicon oxide layer is therefore prevented from cracking or melting, making it possible to provide an interconnection electrode having a highly precise pattern and extremely low stepped portions. A contact hole is made in the silicon oxide layer, and a metal electrode is formed which is connected to the interconnection electrode through the contact hole. The breakdown voltage between the metal electrode and the interconnection electrode is sufficiently high. It is therefore possible with this invention to manufacture a semiconductor device which has a high breakdown voltage and which is thus highly reliable.

What we claim is:

1. A method for manufacturing a semiconductor device comprising:
   (a) forming on a semiconductor substrate an insulating layer having a diffusion window;
   (b) forming an impurity-doped poly-silicon layer on the insulating layer and on that portion of the semiconductor substrate which is exposed through the diffusion window, said impurity being arsenic;
   (c) forming an undoped poly-silicon layer on the impurity-doped poly-silicon layer;
   (d) thermally oxidizing the substrate with the insulating layer, impurity-doped poly-silicon layer and undoped poly-silicon layer, thus diffusing the impurity from the impurity-doped poly-silicon layer into the semiconductor substrate through the diffusion window and converting the undoped poly-silicon layer to a silicon oxide layer;
   (e) forming on the silicon oxide layer an oxidation-resisting mask layer in a desired pattern; and
   (f) thermally oxidizing the substrate with the insulating layer, impurity-doped poly-silicon layer, silicon oxide layer and mask layer, thus converting those portions of the impurity-doped poly-silicon layer which lie beneath those portions of the silicon oxide layer which are exposed through the mask layer to impurity-doped silicon oxide layers, whereby the remaining portions of the impurity-doped poly-silicon layer provide an interconnection electrode layer having a desired pattern.

2. A method according to claim 1, wherein said undoped poly-silicon layer is 500 to 1,000 Å thick.

3. A method according to claim 1 wherein the impurity concentration of said undoped silicon oxide layer is $1 \times 10^{17}$ cm$^{-3}$ or less and that of said impurity-doped silicon oxide layer is $1 \times 10^{18}$ cm$^{-3}$ to $1 \times 10^{22}$ cm$^{-3}$.

4. A method according to claim 1, wherein said oxidation-resisting mask layer is made of silicon nitride.

5. A method according to claim 1, further comprising steps of removing said oxidation-resisting mask layer, forming a contact hole in the silicon oxide layer laid on said interconnection electrode layer, and forming a metal electrode in a region including said contact hole.

6. A method according to claim 1 wherein said impurity-doped poly-silicon layer is formed by chemical vapor deposition.

7. A method according to claim 1 wherein said impurity-doped poly-silicon layer is formed by sputtering.

8. A method according to claim 1 wherein said impurity-doped poly-silicon layer is formed by impurity ion implantation into an undoped poly-silicon layer.

* * * * *